(12) United States Patent
Pritchard et al.

(10) Patent No.: US 10,651,136 B2
(45) Date of Patent: May 12, 2020

(54) TECHNIQUE FOR DECOUPLING PLASMA ANTENNAE FROM ACTUAL CIRCUITRY

(71) Applicant: GLOBALFOUNDRIES Inc., Grand Cayman (KY)

(72) Inventors: David Pritchard, Glenville, NY (US); Lixia Lei, Clifton Park, NY (US); Francisco Ledesma Rabadan, Richardson, TX (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/695,391

(22) Filed: Sep. 5, 2017

(65) Prior Publication Data

US 2019/0074257 A1  Mar. 7, 2019

(51) Int. Cl.
*H01L 23/62* (2006.01)
*H01L 23/60* (2006.01)
*H01L 21/66* (2006.01)
*G01R 31/28* (2006.01)
*H01L 23/525* (2006.01)

(52) U.S. Cl.
CPC .......... *H01L 23/60* (2013.01); *G01R 31/2812* (2013.01); *H01L 22/32* (2013.01); *H01L 22/34* (2013.01); *H01L 23/5256* (2013.01); *H01L 22/14* (2013.01)

(58) Field of Classification Search
None
See application file for complete search history.

(56) References Cited

U.S. PATENT DOCUMENTS

| 6,417,544 B1* | 7/2002 | Jun | H01L 27/0255 257/356 |
| 2008/0157201 A1* | 7/2008 | Marshall | H01L 23/5256 257/350 |
| 2014/0210042 A1* | 7/2014 | Hasegawa | H01L 23/5258 257/529 |
| 2015/0221594 A1* | 8/2015 | Kitajima | H01L 23/5258 257/529 |

FOREIGN PATENT DOCUMENTS

CN        102569289 A  *  7/2012

* cited by examiner

*Primary Examiner* — Ali Naraghi
(74) *Attorney, Agent, or Firm* — Amerson Law Firm, PLLC

(57) ABSTRACT

When forming semiconductor devices, plasma-induced damage may be prevented or restricted by providing a conductive path between critical areas and the substrate of the semiconductor device. According to the present disclosure, a negative effect of any such protective structures on the performance of the semiconductor device may be significantly reduced by permanently interrupting the corresponding electrical connection at any appropriate point in time of the manufacturing sequence. Furthermore, respective fuse structures acting as current-sensitive areas may also be implemented in test structures in order to evaluate plasma-induced currents, thereby providing a possibility for a more efficient design of respective protective structures and/or for contributing to superior process control of critical plasma treatments.

19 Claims, 4 Drawing Sheets

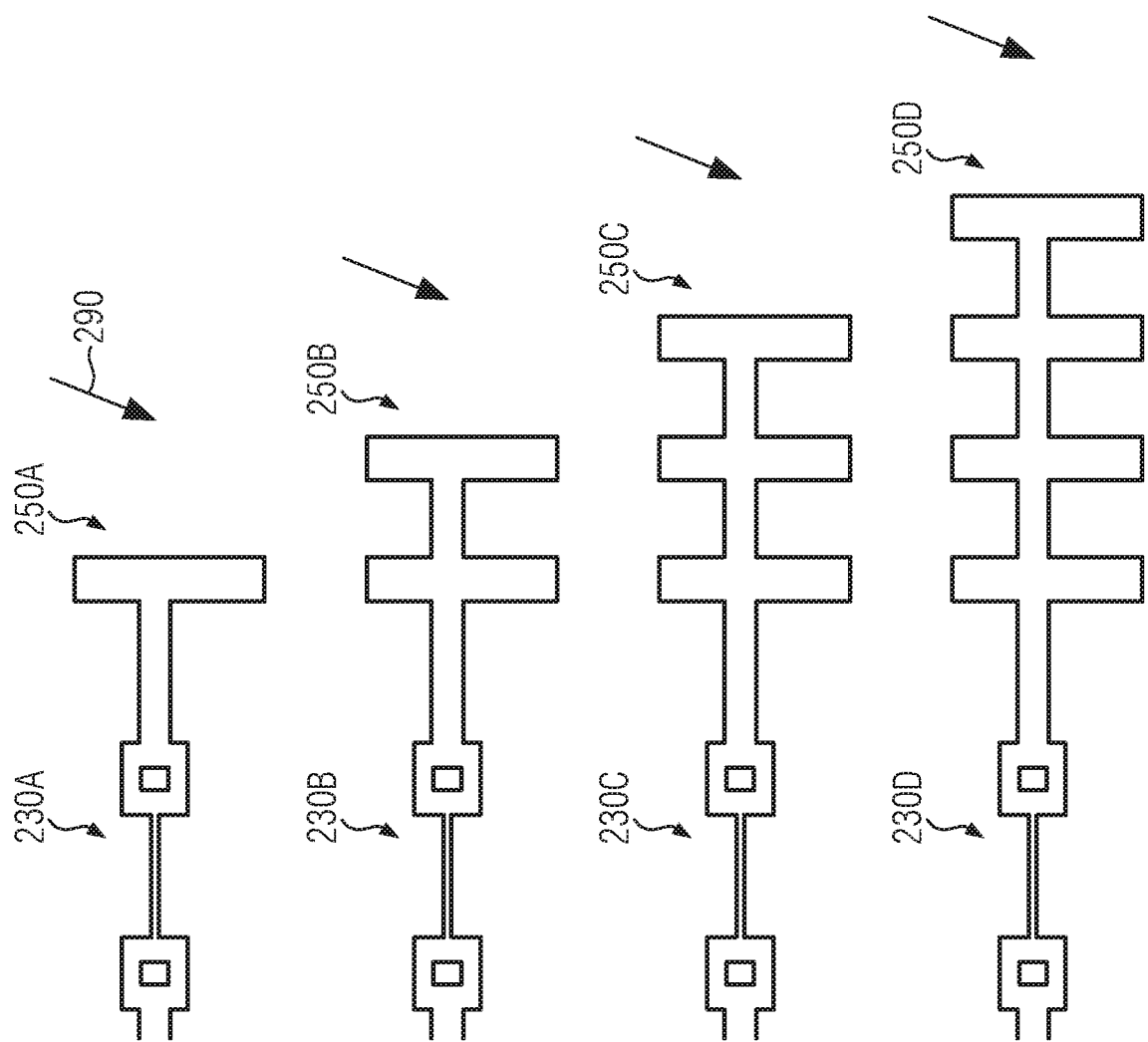

TECHNIQUE FOR DECOUPLING PLASMA ANTENNAE FROM ACTUAL CIRCUITRY

BACKGROUND

1. Field of the Disclosure

Generally, the present disclosure relates to semiconductor devices and, in particular, to techniques for controlling plasma antenna effects during any plasma treatments to be performed during the manufacturing of semiconductor devices.

2. Description of the Related Art

Manufacturing semiconductor products, such as integrated circuits, individual components, such as transistors, diodes and the like, may typically involve a plurality of process steps performed on the basis of an appropriate carrier or substrate material. The substrate material, frequently provided in the form of an appropriate semiconductor material, such as silicon and the like, is processed by patterning specific device-related structures, which typically involves the deposition of one or more appropriate material layers, providing a respective mask layer so as to define the lateral size and shape of the respective features, followed by a patterning process, such as an etch process, in order to remove unwanted material portions of the previously deposited one or more material layers. In this manner, layer-for-layer, further components of a specific circuit element may be formed, wherein precise alignment to the previously patterned layers is required.

During the early phase of semiconductor production, in particular, the patterning of respective material layers on the basis of appropriately configured masking layers was accomplished on the basis of wet chemical etch recipes. Based on these etch recipes, a precise transfer of the lateral dimensions of a respective mask layer into the deeper lying one or more material layers to be patterned was typically a difficult process, since a certain amount of under-etching had to be taken into consideration due to the wet chemical nature of the patterning process. Although, in view of these etch-related difficulties, anisotropic etch techniques have been developed, in which very different etch rates are obtained depending on crystallographic orientations of crystal planes, it still appeared to be very difficult to further reduce the lateral dimensions of circuit patterns, since such anisotropic etch techniques are effective only for crystalline base materials, while other materials, such as oxide materials, nitride materials and the like, still exhibited a significant amount of under-etching, thereby introducing significant process variations into the overall process flow.

Upon introducing plasma-assisted process techniques, significant progress was made in the field of semiconductor fabrication, since from that point on, many processes, in particular, etch processes, could be performed on the basis of a highly directional behavior. That is, by introducing plasma techniques in which certain species in the plasma ambient may be ionized and appropriately accelerated to the substrate material to be treated, thereby obtaining a high degree of directionality of the respective accelerated particles, even the chemical effect of a plurality of etch species could be provided with a well-defined directionality, thereby providing "anisotropic" etch characteristics for respective plasma-assisted removal processes, without being restricted to crystallographic orientations of crystalline materials. The potential for implementing plasma-assisted process techniques has been widely taken advantage of, since, for instance, from that point on, it was possible to transfer respective contours of mask layers into the lower-lying material layers with a high degree of fidelity, while avoiding, or at least significantly reducing, any under-etching effects.

Moreover, plasma-assisted processes have also been introduced into other concepts, such as deposition processes, in which the reactive behavior of certain components can be increased without requiring specific high temperatures, which would otherwise be necessary for initiating a desired chemical reaction. In still other cases, plasma treatments for incorporating certain species, adjusting surface characteristics of specific material layers, and the like, are also frequently applied in sophisticated manufacturing strategies for forming semiconductor devices.

When using a plasma ambient for treating a semiconductor substrate, however, certain side effects are involved, since, depending on the materials exposed to the plasma ambient, the more or less continuous "bombardment" of charged particles may affect exposed surface areas or even underlying material components. That is, certain surface areas may act as "antenna" on which charge may accumulate due to the continuous "bombardment" of charged particles of the plasma ambient. Therefore, the respective charge may have to be discharged in order to prevent undue voltages from building up within the substrate to be treated. For example, when patterning a gate electrode structure for a field effect transistor, a relatively thin gate dielectric material, which may have a thickness of several nanometers and even less in sophisticated devices, may have to be formed in combination with appropriate electrode materials, such as polysilicon and the like. Since a corresponding patterning process requires precise transfer of the mask dimensions into the underlying material layers, respective plasma-assisted etch recipes have to be applied, thereby also contributing to respective adverse side effects of the plasma ambient. During certain phases of the overall patterning process, charge may accumulate in the respective antenna, i.e., for instance, the gate electrode material, and may possibly lead to voltages that may exceed the breakdown voltage of the sensitive gate dielectric materials. Therefore, respective discharge paths may have to be provided for the charge during a plasma treatment in order to reliably restrict the accumulation of charges to a non-critical level. For example, the substrate material may be connected to a corresponding electrode assembly of the plasma process tool in order to discharge unwanted charges, which, in turn, may be discharged from respective critical surface areas into the substrate material. With the introduction of ever-decreasing feature sizes and more complex structures and, in particular, the incorporation of device architectures resulting in substantially vertically isolated device areas, such as semiconductor- or silicon-on-insulator (SOI) configurations, it becomes increasingly difficult to provide appropriate discharge paths for maintaining parasitic voltages at a non-critical level during plasma treatments.

For these reasons, circuit designers have been forced to intentionally add respective discharge structures, such as substrate diodes in combination with appropriate conductive paths, which may connect to critical device features, such as gate electrode structures, drain and source regions and, in particular, to SOI transistors, and the like, so as to provide efficient discharge mechanisms during one or more plasma treatments. Consequently, significant efforts have been made in order to appropriately implement corresponding diode structures, also typically referred to as antenna diodes, into the overall design and to provide appropriate conductive paths that are available during the various stages of the overall manufacturing processes in order to avoid or at least significantly reduce the probability of plasma-induced damage of sensitive device areas.

In recent developments, planar transistor configurations have been introduced with critical dimensions in the range of 30 nm and significantly less, thereby providing the potential for implementing more and more functions into a single integrated circuit. Therefore, radio frequency (RF) devices and analog devices may have to be frequently provided in combination with digital control circuitry, thereby contributing even further to the overall complexity of respective integrated circuits. It appears that circuit elements for RF circuits or circuit portions and analog circuits or circuit portions may particularly exhibit an even further increased sensitivity to the effects of plasma-induced charge generation and exposed surface areas, thereby requiring an even further increased density of respective antenna diodes and corresponding conductive paths.

Although such protective structures have been successfully implemented in modern circuits designs, it appears, nevertheless, that such additional protective structures, which may not have any function during the actual operation of a corresponding semiconductor device, may negatively affect the operational behavior, since such protective structures, such as antenna diodes and the like, are typically associated with additional capacitance and also contribute to increased leakage currents, which may, therefore, have to be taken into consideration when designing and evaluating performance of any such complex semiconductor devices. In particular, in sophisticated fully depleted SOI semiconductor devices, it appears that superior protection of source and drain regions, as well as the gate electrode, may be required, since the source and drain regions, in particular, may no longer act as a direct diode to the substrate due to the SOI architecture. The added parasitic capacitance and leakage contribute to reduced device performance, in particular, in RF and analog circuit portions, as discussed above, and increasingly complicated design may also be necessary for bipolar operation in such sophisticated SOI devices, thereby contributing to increased manufacturing costs and reduced performance. Moreover, upon further increasing the overall complexity of the circuit designs and reduction of critical dimensions, the respective antenna effects during the various plasma treatments may not be precisely predicted, or measurement thereof may be very complex, thereby also contributing to reduced manufacturing efficiency. This, in turn, also results in increased cost due to reduced production yield.

In view of the situation described above, the present disclosure, therefore, relates to semiconductor devices, manufacturing techniques and evaluation strategies in which, generally, adverse effects of plasma treatments on semiconductor devices may be addressed so as to avoid or at least reduce the effects of one or more of the problems identified above.

SUMMARY OF THE DISCLOSURE

The following presents a simplified summary of the disclosure in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Basically, the present disclosure contemplates devices, manufacturing techniques and strategies for addressing the problem of reduced device performance due to parasitic capacitance, leakage currents and the like, associated with the provision of respective protective diode structures and respective conductive paths required for restricting or avoiding plasma-induced damage in sensitive device areas, such as source and drain regions and gate electrode structures of sophisticated transistor elements. To this end, it has been recognized that a functional connection between these sensitive device areas and the protective structures, in particular, the protective diode structures or discharge structures, may be permanently interrupted, since these protective structures are no longer required during the actual operation of the respective semiconductor device.

To this end, appropriate breakable structures, which may be referred to as electronic fuses or simply as fuse structures, may be provided within the conductive path, thereby, on the one hand, ensuring a reliable electrical connection between sensitive device areas and the protective discharge structure during the manufacturing sequence, while, on the other hand, providing the possibility of efficiently and permanently disconnecting the protective discharge structure from the sensitive device areas. The configuration of these fuse structures may, therefore, provide the possibility of reducing the parasitic capacitance associated with the sensitive device areas, in particular with the drain and source regions and the gate electrode structure of sophisticated transistor elements, and also reducing the possibility of inducing leakage currents, wherein a respective disconnection may be accomplished at any appropriate time during the manufacturing process, for instance, at wafer level or even at package level.

In other aspects of the present disclosure, the conductive paths for discharging plasma-related currents may be appropriately configured so as to enable evaluation of respective currents flowing when performing one or more plasma-assisted treatments, such that a determination of respective currents with desired accuracy may be achieved, thereby also achieving an evaluation of the sensitivity to plasma induced charge generation of a respective semiconductor device. On the basis of the respective currents, conductive paths and/or protective discharge structures and/or respective breakable structures, such as fuse structures for permanently disconnecting the protective structures from the sensitive device areas, may be appropriately designed in order to ensure, on the one hand, proper functionality during the manufacturing sequence and, on the other hand, to avoid or reduce undue area consumption due to oversized conductive paths and protective discharge structures in an attempt to accommodate a specific range of possible antenna currents occurring during respective plasma treatments. In other aspects, the evaluation of the plasma-induced discharge currents may be applied to enhance process monitoring and/or process control of plasma-assisted processes.

One illustrative embodiment disclosed herein relates to a semiconductor device. The semiconductor device includes a charge accumulation structure with sensitivity to plasma-induced charge generation. Furthermore, the semiconductor device includes a fuse structure having a first end and a second end, wherein the first end is electrically connected to the charge accumulation structure. Additionally, the semiconductor device includes a discharge structure that is electrically connected to the second end of the fuse structure.

A further illustrative embodiment of the present disclosure relates to a semiconductor device that includes a plurality of charge accumulation structures, each of which has sensitivity to plasma-induced charge generation. The semiconductor device further includes at least one discharge structure. Moreover, the semiconductor device includes a plurality of fuse structures, wherein each of the plurality of fuse structures is electrically connected between a respective one of the plurality of charge accumulation structures and the at least one discharge structure.

According to a further illustrative embodiment, the present disclosure relates to a method of estimating sensitivity to plasma-induced charge generation during semiconductor production. The method includes discharging, through a plurality of conductive paths, charge that is generated in a plurality of charge accumulation structures during one or more plasma treatments. The method further includes determining a status of each of the conductive paths after the one or more plasma treatments. Additionally, the method includes correlating each of the determined statuses with a respective current induced during the one or more plasma treatments in each of the plurality of charge accumulation structures.

BRIEF DESCRIPTION OF THE DRAWINGS

The disclosure may be understood by reference to the following description taken in conjunction with the accompanying drawings, in which like reference numerals identify like elements, and in which:

FIG. 2B schematically illustrates a test structure including regions of varying sensitivity to plasma-induced charge generation, according to further illustrative embodiments.

Figures 1A, 1C:
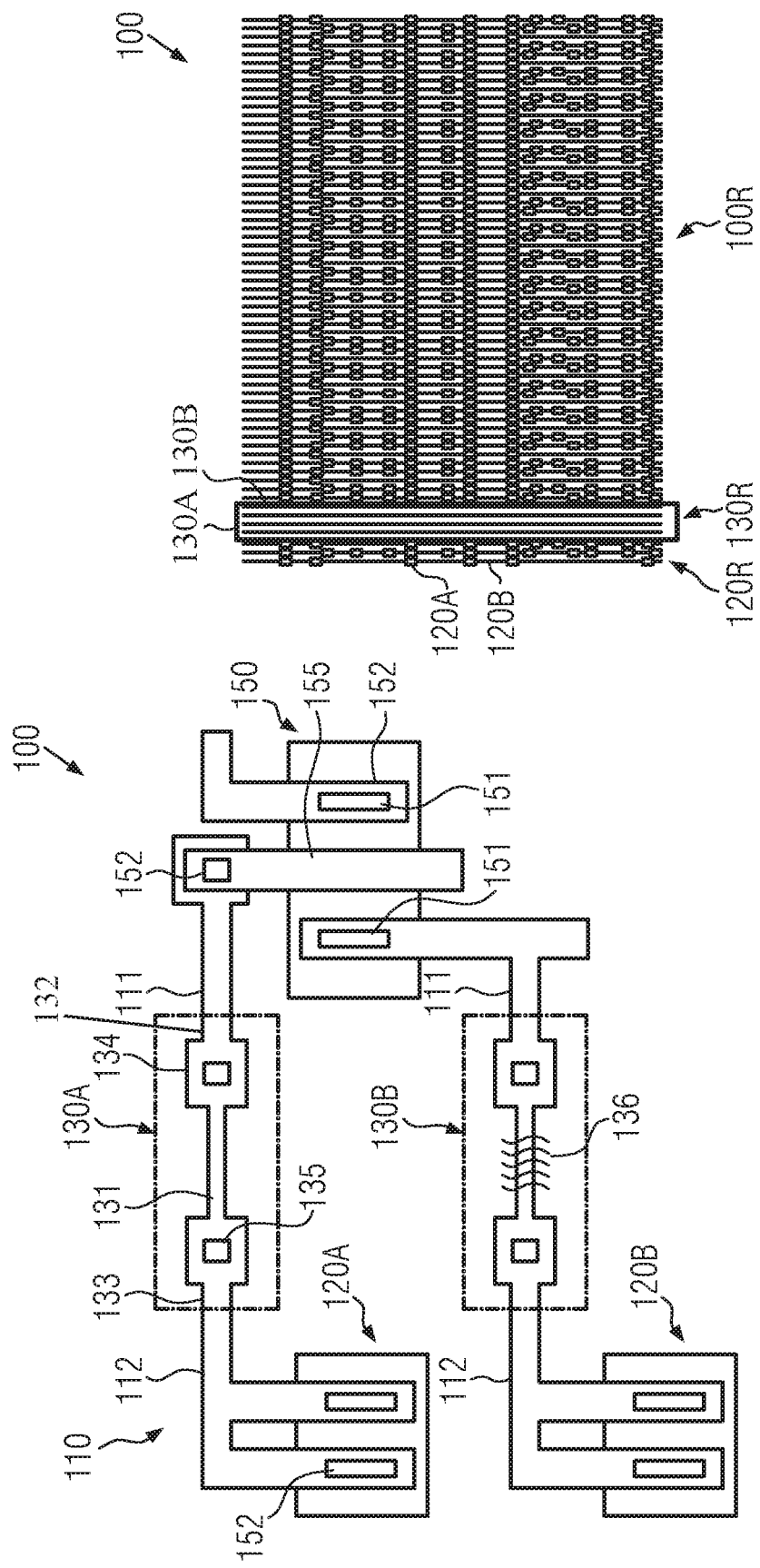
FIGS. 1A and 1B schematically illustrate top views of a semiconductor device, including device areas having sensitivity to plasma-induced charge generation, which are connected to respective protective discharge structures, such as diode structures, via one or more fuse structures for permanently interrupting the electrical connection therebetween.
FIG. 1C schematically illustrates a top view of a complex semiconductor device with regions including sensitive areas, such as drain and source areas, gate electrode structures, and a respective region comprising discharge structures with an intermediate fuse region for permanently interrupting the electrical connection between the sensitive device regions and the discharge structures.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present disclosure will now be described with reference to the attached figures. Various structures, systems and devices are schematically depicted in the drawings for purposes of explanation only and so as to not obscure the present disclosure with details which are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary or customary meaning as understood by those skilled in the art, is intended to be implied by consistent usage of the term or phrase herein. To the extent that a term or phrase is intended to have a special meaning, i.e., a meaning other than that understood by skilled artisans, such a special definition shall be expressively set forth in the specification in a definitional manner that directly and unequivocally provides the special definition for the term or phrase.

As previously discussed, in particular, the protective structures, such as diode structures, which may efficiently drain the current generated during plasma-assisted treatments into the substrate material, may later, during the actual operation of the semiconductor device under consideration, add to additional capacitance and/or leakage currents, however, without being a constituent of the actual circuit design. Therefore, according to the present disclosure, techniques are contemplated in which at least a significant portion of the overall conductive path used for draining off plasma-induced charges during the manufacturing process may be permanently interrupted in such a manner that the disconnected part may have substantially no or at most negligible capacitive coupling to the actual circuit elements with sensitivity to plasma-induced charge generation. That is, in semiconductor devices, critical areas with increased antenna effect during plasma treatments, such as gate electrode structures, drain and source regions of SOI transistor elements and the like, may be efficiently protected during the manufacturing process and a significant portion of the corresponding protective structure may then be disconnected at negligible capacitive coupling between the disconnected portions.

The permanent interruption of the protective structure, in particular the decoupling of the protective diode or discharge structures, may be accomplished by incorporating a "predetermined breaking point" into the conductive path at any appropriate position within the semiconductor device, wherein the "predetermined breaking point" may also provide accessibility during any desired phase after completing any relevant plasma treatments, which may require the draining off of respective plasma-induced charges. The "predetermined breaking point" may also be referred to as an electronic fuse structure, or simply fuse structure, which may have an appropriate configuration so as to withstand the currents typically occurring during the respective plasma treatments, while, on the other hand, enabling the "blowing" of the fuse structure upon applying an appropriate stimulus, such as an electrical current, heat, radiation and the like. Consequently, in the present disclosure, a conductive portion within the overall conductive path for draining off plasma-induced charges may be considered as a fuse structure, as long as this fuse structure is appropriately configured to intentionally disconnect at least the protective discharge structure from the remaining conductive path upon applying a predetermined stimulus or signal. For example, a corresponding fuse structure may be formed in the same manufacturing sequence in which the conductive path is basically formed from a respective sensitive "antenna" area to a corresponding protective discharge structure. Additionally, the fuse structure may be appropriately configured so as to enable access for applying the corresponding stimuli at any later manufacturing stage, wherein the application of the respective stimuli may be performed at wafer level or even in a packaged state of a corresponding semiconductor device.

Furthermore, according to illustrative embodiments of the present disclosure, it is contemplated that the concept of providing accessibility of a portion of a conductive path used for draining off plasma-induced charges in a later manufacturing stage may provide the possibility of evaluating the corresponding plasma-induced currents occurring during the respective plasma treatments. As previously discussed, in many cases, it is extremely difficult to evaluate the sensitivity to plasma induced charge generation, i.e., the respective currents caused by antenna effects during respective plasma treatments and, thus, the respective conductive path and protective structures have to be typically dimensioned so as to cover any "worst case" scenario, thereby typically resulting in oversizing the respective protective structures. Furthermore, knowledge of respective plasma-induced charges and corresponding currents may enable further evaluation of the respective plasma treatments, so that the gained information may be advantageously utilized for superior process control. For example, monitoring of respective plasma-induced currents during specific plasma treatments may not only result in superior knowledge of certain process parameters, such as plasma density and the like, but may also be used for obtaining locally process information on the corresponding plasma treatments. Therefore, in some illustrative embodiments, respective fuse structures may be incorporated, for instance, in product substrates and/or in specifically designed test substrates, wherein respective fuse structures may be implemented, which may allow the determination of resistance changes and/or permanent interruptions that may be caused by the respective plasma-induced currents.

As a consequence, the various aspects disclosed herein may provide devices and strategies in which the conductive path implemented in the various device layers for draining off plasma-induced charges during specific plasma treatments may be permanently interrupted and/or may be evaluated with respect to the respective plasma-induced currents, thereby significantly improving device performance due to reduced parasitic capacitance and/or leakage currents and/or may contribute to superior process quality of plasma treatments by correlating the plasma-induced currents with one or more parameters of respective plasma treatments.

FIG. 1A schematically illustrates a top view of a semiconductor device 100, which may typically include a plurality of active circuit elements, such as field effect transistors, bipolar transistors, diodes or the like, possibly in combination with respective passive circuit elements, such as resistors, capacitors and the like. Typically, any such circuit elements may be formed in the semiconductor device 100 in accordance with certain design criteria on the basis of a specified process technique, such as CMOS techniques and the like, in order to form a specific integrated circuit of well-defined functionality. For convenience, from these many circuit elements that are typically present in the semiconductor device 100, a transistor element 150 is illustrated, which may be provided in the form of a field effect transistor having an SOI architecture, since in this case, the problem of plasma-induced charge generation during specific plasma treatments may be of specific interest and may require specific countermeasures due to the efficient electrical isolation of, for instance, the drain and source regions, which may no longer form a respective diode structure for draining off charges into the depth of the substrate material, as discussed above.

The transistor 150 may, in some illustrative embodiments, represent a transistor element of a sophisticated semiconductor device formed on the basis of a fully depleted transistor configuration using a very thin semiconductor material, such as a silicon material, a silicon/germanium material and the like, wherein an initial thickness may be 15 nm and even significantly less. Furthermore, particular dimensions of the transistor element 150 may be 30 nm and less in sophisticated planar fully depleted SOI devices. It should be appreciated, however, that the principles disclosed herein, although providing specific operational advantages, as well as superior process control for sophisticated CMOS techniques, may be applied to any semiconductor device and manufacturing strategy in which plasma-induced charges need to be drained off during respective treatments on the basis of specifically designed protective structures, such as substrate diodes and the like.

The transistor element 150 may comprise drain and source regions 151, which may represent respective highly doped semiconductor materials, at least in a moderately advanced manufacturing stage of the semiconductor device 100, wherein, in sophisticated applications, the drain and source regions 151 may be provided in the form of a raised configuration, including a highly in situ doped semiconductor material so as to connect to a channel region (not shown) that is positioned below a gate electrode structure 155. Depending on the overall device configuration, the gate electrode structure 155 may comprise a sophisticated material system, such as a gate dielectric based on a high-k dielectric material, a metal species including barrier and electrode materials, and the like. Furthermore, as previously discussed, in sophisticated applications, the gate electrode structure 155 may be formed on the basis of critical dimensions, i.e., a gate length, for instance, in FIG. 1A, the horizontal extension of the gate electrode structure 155, except for lateral dimensions of any sidewall spacer elements (not shown), of 30 nm and significantly less. Furthermore, in SOI devices, a buried insulating layer (not shown) may be typically formed at least below the drain and source regions 151 and the channel region (not shown), thereby obtaining superior transistor performance with respect to parasitic capacitance and the like, wherein, however, as discussed above, the advantage of parasitic capacitance and, thus, reduced switching speed, may be partially offset by the necessity to conductively connect the drain and source regions 151 with a respective conductive path 110 provided for draining off charges generated during a plasma treatment, as already discussed above. Furthermore, in some illustrative embodiments, the transistor element 150 may represent a transistor with a fully depleted channel region, thereby also contributing to superior transistor performance due to the many advantages associated with a fully depleted transistor configuration.

Moreover, a plurality of protective structures or discharge structures 120A, 120B may be provided and may be frequently formed as diode structures, one end of which may be connected to a respective area of the semiconductor device 100 that is sensitive to plasma-induced charge generation during specific plasma treatments, whereas the other end of the discharge structures 120A, 120B may be connected to the substrate material, which, in turn, may be electrically connectable to an electrode during a plasma treatment for equalizing, at least to a certain degree, any voltages that may build up due to charge accumulation during plasma treatments. For example, the discharge structures 120A, 120B may be provided in the form of doped areas in the semiconductor device 100, including a respective PN junction (not shown) so as to provide a current path into the substrate material for a given current flow direction, while substantially preventing a current flow in the opposite direction, except for respective leakage currents and the like.

Furthermore, the discharge structures 120A, 120B, as well as the transistor element 150, may comprise respective contact regions 152, which may be represented by any appropriately configured device areas, such as metal semiconductor compounds in the form of metal silicide and the like. Furthermore the discharge structures 120A, 120B may be electrically connected to the respective plasma-sensitive areas or antennae, i.e., areas having sensitivity to plasma induced charge generation, such as the transistor element 150, by a conductive path 110, which may include any appropriate conductive elements, such as line portions in the form of semiconductor material, metal material and the like, depending on the respective device level at which a draining off of plasma-induced charge carriers may be required during respective plasma treatments. That is, the conductive path 110 may be formed in the semiconductor level, for instance, by respective conductive semiconductor lines and the like, if corresponding plasma-induced charges may have to be drained off in an early manufacturing stage in order to avoid undue damage of sensitive device areas, such as the drain and source regions 151 and the gate electrode structure 155. In other cases, at least a portion of the conductive path 110 may be formed within the contact level, i.e., a device level in which appropriate dielectric materials may be formed above the transistor element 150 and may include respective contact elements, which may provide electrical connection to the respective contact regions 152. That is, the conductive path 110 and the discharge structures 120A, 120B have to be implemented in a functional manner prior to actually performing respective plasma treatments, which may otherwise significantly damage the plasma-sensitive areas, such as the drain and source regions 151 and the gate electrode structure 155. For example, upon patterning the contact level and in particular one or more metallization layers (not shown) of a metallization system (not shown), plasma-assisted etch recipes may be typically applied, which may result in significant charge generation that may be efficiently drained off via the conductive path 110 and the discharge structures 120A, 120B when the respective components, in particular, of the conductive path 110, are already in place. In particular, when forming metal areas in one or more of the following metallization layers (not shown), a corresponding accumulation of charges may typically occur and may also require an effective discharge mechanism via the discharge structures 120A, 120B. Consequently, many device layers positioned below a subsequent device layer that requires a plasma treatment may be advantageously used for implementing the conductive path 110 so as to provide an efficient discharge mechanism. On the other hand, the discharge structures 120A, 120B may be formed together with the transistor element 150 and may be functionally in place as soon as the drain and source regions 151 of the transistor elements 150 have been formed and the respective connections to the discharge structures have been established.

The conductive path 110 may include a plurality of fuse structures 130A, 130B, which are appropriately configured so as to enable a permanent interruption of the conductive path 110 upon completing a specific phase of the overall manufacturing process of the semiconductor device 100. To this end, the fuse structures 130A, 130B may have implemented therein a mechanism for decoupling the discharge structures 120A, 120B from the one or more plasma-sensitive areas, such as the drain and source regions 151, the gate electrode structure 155 and the like, on the basis of a low-capacitance decoupling mechanism. That is, in some illustrative embodiments, the fuse structure may be "blown" by applying any appropriate signal or stimulus, thereby physically interrupting at least a portion in the fuse structure. That is, in illustrative embodiments, a first end 132 of the fuse structures 130A, 130B may be connected to a sensitive area, which may also be referred to herein as a charge accumulation structure due to its antenna effect or its effect for accumulating charges that may be generated elsewhere during a respective plasma treatment. For example, the fuse structure 130A is connected with its first end 132 to the gate electrode structure 155 acting as one of a plurality of charge accumulation structures. To this end, the first end 132 may be connected to a respective conductive portion 111, which, in turn, may finally connect to the contact region 152. It should be appreciated that, depending on the overall requirements and the respective device level, the conductive portion 111 may be provided within a single device level or may extend across two or more device levels so as to finally connect to the contact region 152.

The fuse structures 130A, 130B may further comprise a second end 133 that is connected to a further conductive portion 112 that establishes electrical connection to the respective contact regions 152 of the discharge structures 120A, 120B. It should be appreciated that the conductive path 110, including the conductive portions 111 and 112, may be basically configured so as to reliably withstand any current flow that may be caused during respective plasma treatments, and the interruptible fuse structures 130A, 130B may also be appropriately configured to reliably carry the respective plasma-induced currents. That is, basically, a current-carrying capacity of the conductive path 110 and of the discharge structures 120A, 120B is sufficiently dimensioned so as to reliably drain off any plasma-induced currents.

As will be explained later on with reference to FIGS. 2A and 2B, specific mechanisms and strategies may be implemented so as to specifically design the current-carrying capacity of the respective components of the conductive path 110 and the discharge structures 120A, 120B so as to comply with the overall requirements, while not unduly consuming space in the semiconductor device 100, since increased current-carrying capacity is typically associated with increased area of respective conductive lines and line portions.

In order to enable a reliable permanent interruption of the conductive path 110, the fuse structures 130A, 130B may include respective fuse portions 131, provided, for instance, in the form of a certain conductive portion with specified cross-sectional area, which may have a reduced current-carrying capacity compared to the remaining portions of the conductive path 110. Furthermore, with respect to providing accessibility of the fuse portion 131, corresponding contact regions 134, 135 may be provided so as to laterally enclose the fuse portion 131. In this manner, in some illustrative embodiments, an appropriate current signal may be injected into the fuse portion 131 by applying an appropriate voltage across the contact regions 134, 135, which may result in generation of heat, which, in turn, may permanently "blow" the fuse portion 131, substantially without electrically affecting other device areas.

It should be appreciated that the contact regions 134, 135 are configured so as to provide accessibility to the fuse structures 130A, 130B at any appropriate point in time of the overall manufacturing process, for instance, at a very advanced phase of the overall manufacturing sequence, for instance, when performing electrical tests and the like. Thus, the contact regions 134, 135 may include respective contact pads (not shown) that enable contact with respective electrical probes at any desired phase of the manufacturing process. These contact pads may be provided at any appropriate device level, for instance, in a metallization system (not shown), on top of the metallization system together with other connect pads that are required for thermal and electrical contact of the semiconductor device 100, and the like.

The semiconductor device 100 as shown in FIG. 1A may be formed on the basis of the following processes. Upon forming circuit elements, such as the field effect transistor 150, an appropriate substrate may be provided and processed so as to receive appropriately doped semiconductor regions, isolation structures and gate electrodes, in accordance with overall device requirements. As already discussed above, in some illustrative embodiments, the substrate material may be provided in the form of an SOI substrate, including a substantially crystalline substrate material, a buried insulating layer and an active semiconductor layer. In this case, at least some of the circuit elements, such as the transistor 150, may be formed on the basis of an SOI configuration, thereby typically requiring, in later plasma-assisted processes, the conductive path 110 and the discharge structures 120A, 120B for removing plasma-induced charges.

Patterning of the gate electrode structure 155 may involve sophisticated lithography and etch techniques, wherein, when respective plasma-assisted etch recipes may result in undue plasma-induced charge generation, the conductive path 110 may have to be implemented in the device level of the semiconductor device, together with the discharge structures 120A, 120B, possibly in the form of respective doped regions in the semiconductor layer and the substrate materials, which may be accomplished on the basis of respective implantation processes and the like.

Thereafter, any further components of the transistor elements 150 may be formed, such as the drain and source regions 151, for instance by selective epitaxial growth with in situ doping of the deposited semiconductor material, while also forming, if required, a part of the discharge structures 120A, 120B, such as the respective portion of the contact regions 152 and the like. Thereafter, the contact regions 152 may be formed, for instance, by applying sophisticated silicidation processes, followed by the formation of a contact level, as already discussed above. Upon performing respective plasma-assisted processes, such as anisotropic etch recipes and plasma-assisted deposition processes, the conductive path 110 may result in the draining off of corresponding plasma-induced charges, thereby avoiding, or at least restricting, plasma-induced damage in any charge accumulation structures, such as the drain and source regions 151 and the gate electrode structure 155.

It should be appreciated that, upon patterning the conductive path 110, including the fuse structures 130A, 130B positioned at any appropriate location within the semiconductor device 100, at least one characteristic of the fuse structures 130A, 130B may be formed so as to enable the permanent interruption of the conductive path 110 upon applying an appropriate signal or stimulus. For example, in some illustrative embodiments, the fuse portions 131 may be formed so as to create sufficient damage therein in a reliable manner upon injecting a current with sufficient magnitude, so as to interrupt the connection between the first end 132 and the second end 133 of the fuse structures 130A, 130B. To this end, in some illustrative embodiments, for a given material composition of the fuse portion 131, a reduced cross-sectional area thereof, i.e., a reduced width, may be implemented so as to obtain the "blowable" nature of the fuse portion 131. In other illustrative embodiments, the fuse portion 131 may receive a different treatment compared to the remaining conductive portions 111, 112 and the contact regions 134, 135 so as to provide reduced electrical conductivity, for instance, by reducing a dopant concentration, avoiding the formation of a metal silicide, or forming metal silicide with reduced thickness, and the like. In any case, the fuse structures 130A, 130B are formed so as to exhibit a different, i.e., reduced, current-carrying capacity compared to the remaining conductive portions 111 and 112.

Thereafter, respective contact pads, which may also be denoted by reference numerals 134, 135, may be provided so as to connect to the fuse structures 130A, 130B and additionally provide accessibility to the fuse structures 130A, 130B at any desired device level. To this end, the contact regions 134, 135 may extend through a specific portion of a metallization system to be formed, or may extend through the entire metallization system (not shown), thereby enabling access to the fuse structures 130A, 130B even in a final phase of the overall manufacturing process.

As discussed above, when manufacturing the semiconductor device 100, the protective structure in the form of the conductive path 110, including the fuse structures 130A, 130B and the discharge structures 120A, 120B, may be functionally in place prior to performing any critical plasma treatments, thereby substantially avoiding any potentially damaging voltage differences across the respective charge accumulation structures, such as the drain and source regions 151 and the gate electrode structure 155. At any desired phase of the overall manufacturing flow, after performing the respective critical plasma treatments, at least some of the fuse structures 130A, 130B may be accessed in order to initiate permanent damage and, thus, interruption of the electrical connection between the charge accumulation structures 151, 155 and the corresponding discharge structures 120A, 120B. The corresponding access may be established by mechanisms, such as using electrical probes, directly providing heat to the respective fuse structure, irradiating specific radiation, and the like, as long as the respective fuse structure 130A, 130B may be accessed by any of these stimuli. As an example, a corresponding massive damage and, thus disconnection, is indicated by reference numeral 136. In this case, the conductive portions 111 and 112 are no longer in electrical contact with each other, thereby decoupling the discharge structure 120B from the corresponding charge accumulation structure, i.e., one of the drain and source regions 151. It should be appreciated that the damaged portion 136 providing the permanent decoupling of the structures 120B, 151, may typically result in negligible capacitive coupling between these components, thereby significantly contributing to a reduced overall parasitic capacitance of a corresponding charge accumulation structure 151. The same holds true for the charge accumulation structure 155, i.e., the gate electrode structure, connected to the fuse structure 130A, when a corresponding electrical decoupling is considered appropriate for performance of the transistor 150.

Figure 1B:
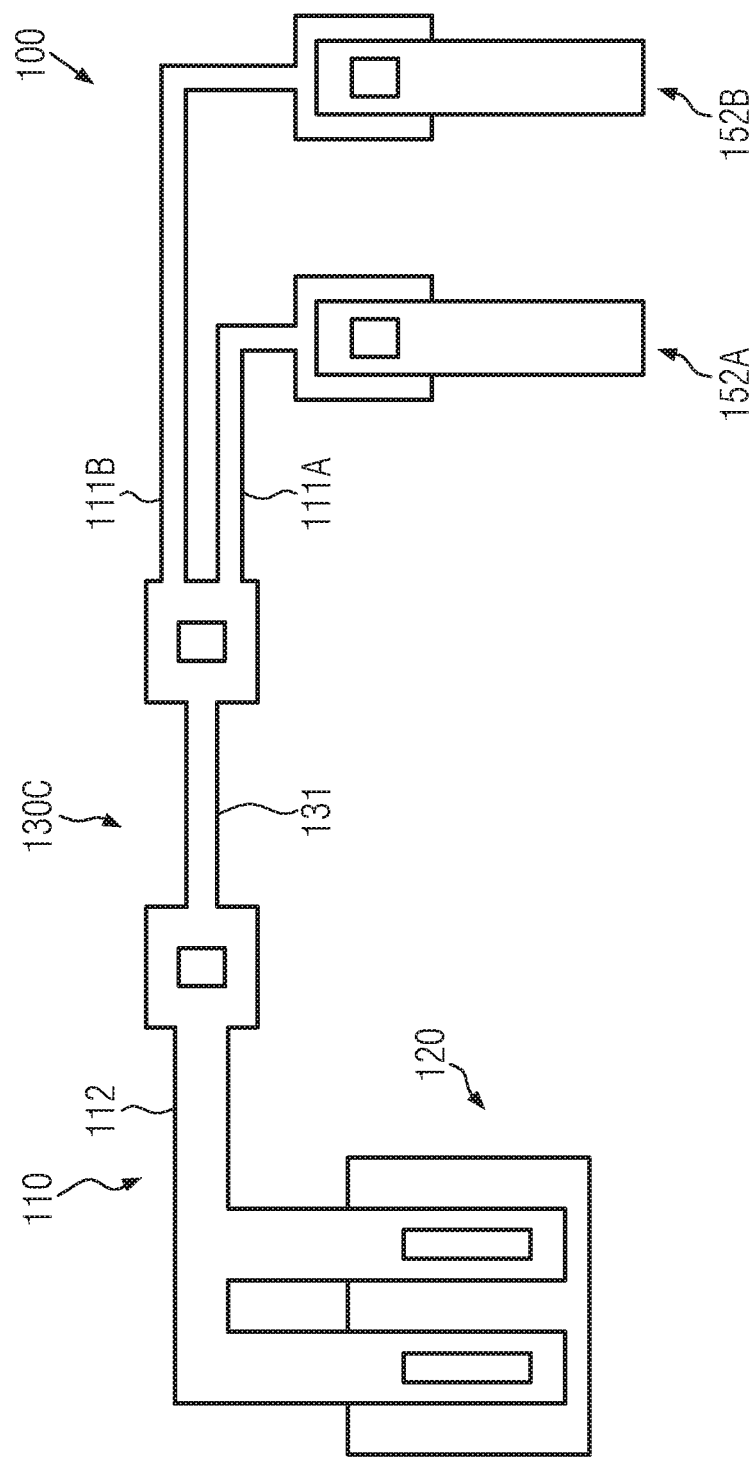

FIG. 1B schematically illustrates a top view of the semiconductor device 100 according to further illustrative embodiments, in which a plurality of charge accumulation structures 152A, 152B may be connected to a single fuse structure 130C. Furthermore, depending on the current-carrying capacity of a discharge structure, the fuse structure 130C may be connected to a single discharge structure 120, as shown in FIG. 1B, while, in other cases, a plurality of discharge structures may be provided, as shown in FIG. 1A, and may be connected to the fuse structure 130C. The charge accumulation structures 152A, 152B may represent gate electrode structures or drain and source regions and the like of a plurality of sensitive circuit elements and may be connected to the single fuse structure 130C by conductive portions 111A, 111B, respectively. Consequently, the fuse structure 130C may be configured so as to reliably provide the current-carrying capacity required for accommodating the plasma-induced current flows in the conductive portions 111A, 111B, while, nevertheless, enabling a reliable permanent damaging of the fuse portion 131 upon applying a respective signal or stimulus. Consequently, by applying the configuration as shown in FIG. 1B, a reduced number of fuse structures and/or discharge structures may be sufficient so as to reliably protect the charge accumulation structures 152A, 152B during the critical plasma treatments, while insuring appropriate electrical decoupling in a later manufacturing stage by "blowing" the fuse structure 130C.

FIG. 1C schematically illustrates a top view of the semiconductor device 100 according to illustrative embodiments wherein a region 120R for discharge structures, a fuse region 130R and a device region 100R are laterally positioned adjacent to each other. As illustrated, the region for discharge structures 120A, 120B . . . , may be positioned at an outer perimeter of the semiconductor device 100, while the fuse region 130R, including the fuse structures 130A, 130B . . . may be positioned next to the device region 100R, thereby substantially minimizing the corresponding conductive portions between the fuse structures and respective charge accumulation structures, such as critical device areas in the form of the drain and source regions 151 and the gate electrode structures 155 (see FIG. 1A). It should be appreciated that the corresponding conductive paths 110 (see FIGS. 1A, 1B) may have to be provided anyway and, therefore, additional area consumption in the semiconductor device 100 compared to conventional devices which do not provide the fuse structures 120A, 120B . . . is acceptable, particularly in view of the significant advantages obtained by performance increase due to the reduction of parasitic capacitance and/or leakage currents.

In other cases, as will be described later on in more detail, the area consumption of the protective structures for discharging plasma-induced currents may be adjusted on the basis of a respective evaluation of plasma-induced currents on the basis of test structures, which may be implemented in specific test substrates, so that even a reduced area consumption may be accomplished compared to conventional strategies.

Figure 2A:
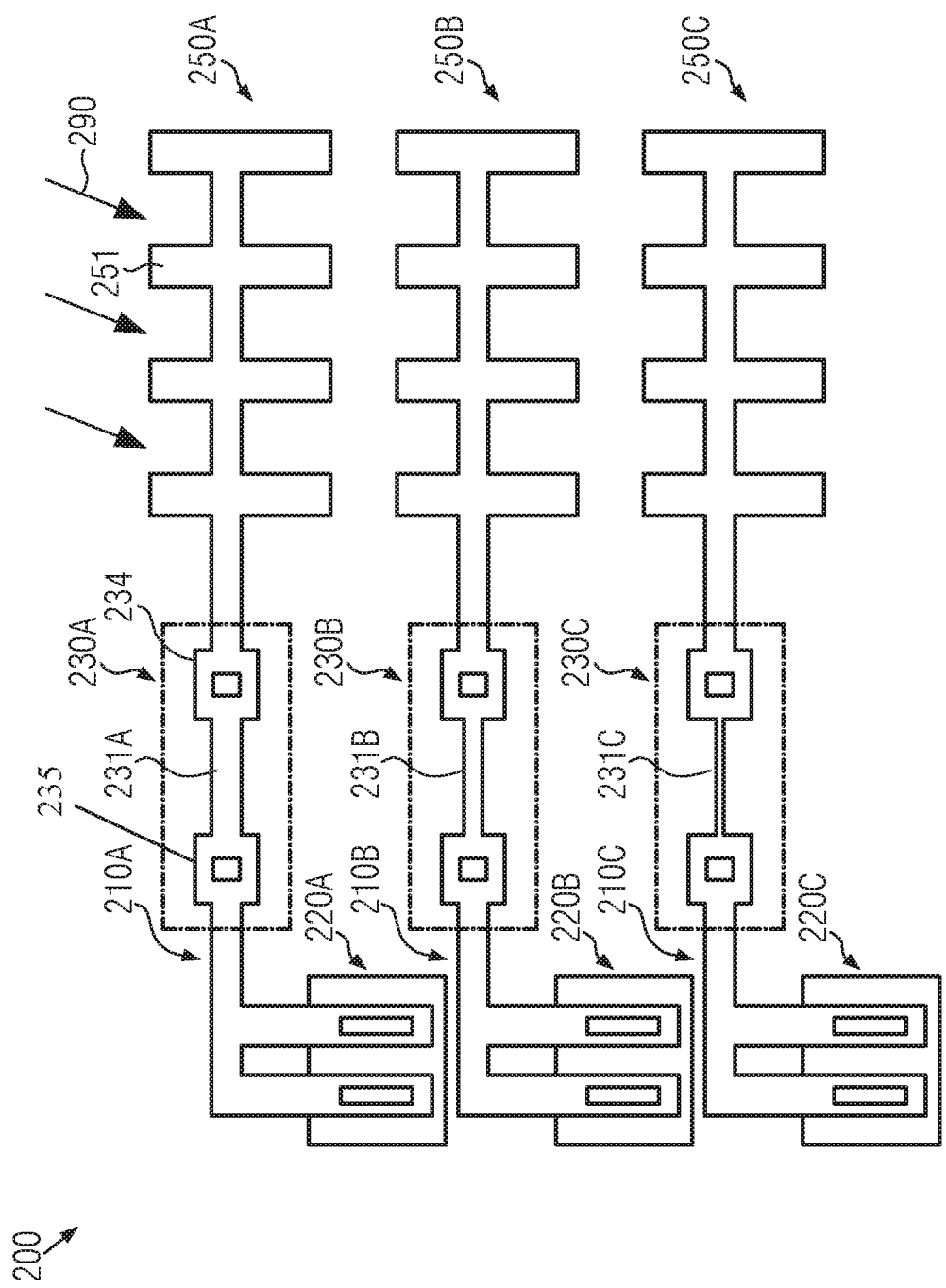
FIG. 2A schematically illustrates a top view of a semiconductor device including a plurality of test structures that are sensitive to plasma-induced charge generation and which are electrically connected by respective conductive paths to one or more discharge structures, wherein the conductive paths include a portion of varying current carrying capability for evaluating respective plasma-induced currents.

FIG. 2A schematically illustrates a top view of a semiconductor device 200, which, in some illustrative embodiments, may include circuit elements in the form of transistors and the like, which may be fully functional and which may be used as operational semiconductor devices after completing a respective manufacturing process, while, in other illustrative embodiments, the semiconductor device 200 may represent a specifically designed test device, possibly including other test structures, possibly in combination with functional circuit elements and the like.

As shown, the semiconductor device 200 may comprise a plurality of charge accumulation structures 250A, 250B, 250C, which may be understood as areas sensitive to plasma-induced charge generation when subjected to a respective plasma ambient, schematically illustrated as 290. As already noted above, in some cases, the charge accumulation structures themselves may be considered as plasma antennae, while, in other cases, they may not necessarily act as actual antennae but may represent "end portions" of respective plasma antennae, where charge would unduly accumulate without discharge mechanisms. For example, the charge accumulation structures 250A-250C may be formed on the basis of design criteria and design rules which may also be applied to actual circuit components, such as gate electrode structures, drain and source regions and the like. For example, respective portions 251 of the charge accumulation structures 250A-250C may have a configuration similar to drain and source regions or gate electrode structures and may be formed on the basis of similar critical dimensions and a corresponding material composition. Moreover, in some illustrative embodiments, the structures 250A-250C may be embedded laterally and vertically device components that may be very similar to actual device components, thereby achieving a high degree of authenticity of the structures 250A-250C compared to actual product semiconductor devices. Furthermore, the structures 250A-250C may be formed on the basis of an SOI configuration in some illustrative embodiments. Moreover, the charge accumulation structures 250A-250C may be positioned in specific device regions of the semiconductor device 200 in close proximity to each other, thereby allowing assessment of specific parameters of one or more of the plasma treatments 290. In other cases, a plurality of respective arrangements or even individual charge accumulation structures 250A-250C may be positioned at very different positions across the entire substrate of the semiconductor device 200 in order to assess overall uniformity of respective process parameters of the plasma ambient 290.

Moreover, the semiconductor device 200 may comprise a plurality of fuse structures 230A, 230B, 230C, which may be connected, respectively, to the plurality of charge accumulation structures 250A-250C, and may also be connected to respective one or more discharge structures 220A, 220B, 220C. Moreover, the fuse structures 230A-230C may have a configuration as discussed above with reference to FIGS. 1A-1C. That is, the fuse structures 230A-230C may represent a part of respective conductive paths 210A, 210B, 210C that electrically connect the respective charge accumulation structures 250A-250C with one or more of the discharge structures 220A-220C. Furthermore, the fuse structures 230A-230C are appropriately configured to allow access at any appropriate manufacturing stage, such as prior to and after respective plasma treatments, in order to evaluate any differences in resistance and other functional behavior of the fuse structures 230A-230C after having experienced respective currents induced by the plasma ambient 290. For example, access to the fuse structures 230A-230C may be obtained by respective contact regions 234, 235 on the basis of electrical probes and the like. In some illustrative embodiments, the fuse structures 230A-230C may comprise respective fuse portions 231A-231C, which may have a current-carrying capacity that is equal to or less than the current-carrying capacity of the respective conductive paths 210A-210C. Consequently, as also discussed above, these fuse portions 231A-231C may represent the "weak" point in the conductive paths 210A-210C and may, therefore, represent respective portions in which the plasma-induced current may have the highest effect.

In the embodiment shown in FIG. 2A, the current accumulation structures 250A-250C may have substantially the same sensitivity to plasma-induced charge generation when exposed to the plasma ambient 290, which may be accomplished by providing substantially the same geometric configuration and material composition in the structures 250A-250C. Consequently, it may be expected that the respective antenna effect may result in substantially the same amount of charge accumulation in the structures 250A-250C, as long as the respective discharge structures 220A-220C are also of substantially identical configuration. Therefore, by differently configuring the fuse structures 230A-230C, a different effect may be expected to occur in these areas, thereby providing the possibility of evaluating the corresponding plasma-induced currents that are actually flowing. In some illustrative embodiments, to this end, the fuse portions 231A-231C may be provided with different current-carrying capacities, for instance, by forming these fuse portions with different line widths, as shown, while, in other cases, any other different behavior may be implemented by using different materials and the like, as is also discussed above with reference to the fuse structures 120A, 120B of FIG. 1A. For example, the fuse portion 231C may have the lowest current-carrying capacity and may, therefore, respond more intensively to a given current compared to the fuse portions 231B, 231A. Similarly, the fuse portion 231B may have a reduced current-carrying capacity compared to the fuse portion 231A and may, therefore, respond more sensitively to the same current compared to the fuse portion 231A.

The semiconductor device 200 as shown in FIG. 2A may be formed on the basis of similar process strategies as also discussed above with reference to the semiconductor device 100, wherein, in illustrative embodiments, the charge accumulation structures 250A-250C may be formed in accordance with design criteria, as may be represented by actual circuit elements, thereby significantly increasing the degree of authenticity of the test structures 250A-250C. Similarly, the conductive paths 210A-210C and the discharge structures 220A-220C may be formed in accordance with the overall device requirements so as to resemble respective actual discharge structures, such as the structures 120A, 120B as previously discussed in the context of FIG. 1A. Similarly, the fuse structures 230A-230C may be formed in accordance with the required design criteria and design rules, except for the difference in current-carrying capacities, which may be specifically designed so as to obtain a certain range for evaluating respective plasma-induced currents. Moreover, as already discussed above, the charge accumulation structures 250A-250C, the fuse structures 230A-230C, and the discharge structures 220A0220C may be formed at any appropriate device level and, thus, at any manufacturing stage in which the charge equalization during the plasma ambient 290 is required, as is also discussed above in the context of the semiconductor device 100.

When using the semiconductor device 200, in some illustrative embodiments, electrical characteristics of the fuse structures 230A-230C may be initially assessed, for instance, by determining respective resistance values of the fuse portions 231A-231C, which may be accomplished by accessing these portions in a manufacturing stage prior to exposing the semiconductor device 200 to the plasma ambient 290 and/or by providing at least some semiconductor devices 200 or portions thereof which may not be exposed to the plasma ambient 290. After the one or more plasma treatments associated with the plasma ambient 290, the fuse portions may be accessed, for instance, by electrical probes and the like, so as to estimate the status of the fuse structures 230A-230C. For instance, a resistance measurement may be performed for estimating the degree of damaging to the fuse portions 231A-231C and/or using any other appropriate measurement technique, such as microscopy and the like, wherein a corresponding parameter, such as the measured electrical resistance or a degree of physical damage and the like, may be used for establishing a correlation between a current flow during the plasma treatment and the corresponding measured parameter. For example, in some illustrative embodiments, a simple "digital" evaluation of the plasma-induced currents may be accomplished by determining the one or more fuse portions 231A-231C, which may have suffered permanent damage and which may have resulted in permanent interruption of the respective conductive path. In this manner, a minimum required current-carrying capacity of a respective fuse structure may be determined for given process parameters of a plasma treatment represented by the plasma ambient 290. The respective "resolution" for determining an appropriate parameter value indicative of the plasma-induced current may be adjusted by providing a certain number of different fuse structures having different current-carrying capacities.

Consequently, for a given process recipe of one or more plasma treatments, represented by the plasma ambient 290, the resulting plasma-induced current may be evaluated and may be used for determining an appropriate current-carrying capacity for a respective fuse structure, thereby avoiding undue oversizing of respective fuse structures. Similarly, the evaluation obtained on the basis of the semiconductor device 200 may also be used to appropriately dimension the discharge structures 220A-220C, thereby also providing the potential of using a discharge structure of "minimum" size so as to comply with the requirements of respective plasma treatments, however, without wasting precious semiconductor area within a respective product device.

Moreover, as already discussed above, examining modifications induced in the respective conductive paths 210A-210C, that is, in the fuse structures 230A-230C, may also provide superior process control of respective plasma treatments that are based on the ambient 290, since, for instance, geometry-dependent effects and/or position-dependent effects, as well as plasma uniformity, may be evaluated. For example, plasma non-uniformities may be detected by appropriately positioning the structures as shown in FIG. 2A across an extended area of a substrate to be processed on the basis of the plasma ambient 290. Furthermore, the geometric configuration of the charge accumulation structures may be varied so as to obtain different sensitivities, if considered appropriate.

FIG. 2B schematically illustrates a top view of the semiconductor device 200 according to further illustrative embodiments in which a plurality of charge accumulation structures 250A-250D may be provided, for instance in the form of a test structure, at any appropriate position within the semiconductor device 200, as already discussed above with reference to FIG. 2A. In this embodiment, the corresponding charge accumulation structures 250A-250D may be connected to the fuse structures 230A-230D, which may be configured so as to exhibit substantially the same current-carrying capacity. On the other hand, the charge accumulation structures 250A-250D may be formed so as to exhibit a different sensitivity to the plasma ambient 290, thereby inducing different plasma-induced currents. Also in this case, the respective fuse structures 230A-230D may be accessed at any appropriate stage after performing the plasma treatments associated with the plasma ambient 290 and a corresponding modification thereof may be determined, for instance, in the form of a modified electrical resistance, a respective damage, or even a total interruption of the respective conductive path. Also in this case, the respective parameter obtained by examining the respective fuse structures 230A-230D may be correlated with the plasma ambient 290 so as to provide further information with respect to superior process control of respective plasma treatments and/or for appropriately designing the fuse structures and discharge structures in actual product devices. It should be appreciated that different sensitivity to plasma-induced charge generations may be accomplished by appropriately varying the "antenna area" of the charge accumulation structures 250A-250D on the basis of otherwise identical device features. In other cases, any other appropriate geometric configuration may be selected, which may result in different sensitivity to plasma-induced charge generation.

As a result, the present disclosure provides semiconductor devices which include a mechanism for permanently interrupting a conductive path between sensitive device areas acting as charge accumulation structures during plasma treatments, such as drain and source regions and gate electrode structures of SOI transistor elements, and respective discharge structures, such as diodes and the like, thereby significantly reducing parasitic capacitance and/or leakage currents. Permanent interruption may be accomplished on the basis of fuse structures that may be accessible at any appropriate point in time of the overall manufacturing flow after having experienced the respective critical plasma treatments. In further concepts of the present disclosure, test structures may be provided so as to estimate plasma-induced currents, for instance, on the basis of damage or resistance variations of fuse structures, caused during the plasma treatment, thereby contributing to an adapted design of the overall protective structure and/or achieving superior process control with respect to critical plasma treatments.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a short-hand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A semiconductor device, comprising:
    a charge accumulation structure, wherein said charge accumulation structure comprises at least one of a gate electrode structure, a drain region and a source region of a transistor element;
    a first fuse structure having a first end and a second end, said first end of said first fuse structure being electrically connected to said charge accumulation structure;
    a second fuse structure having a first end and a second end, said first end of said second fuse structure being electrically connected to said charge accumulation structure; and
    a discharge structure electrically connected to said second end of said first fuse structure.

2. The semiconductor device of claim 1, wherein said discharge structure comprises a diode connecting said discharge structure to a substrate material of said semiconductor device.

3. The semiconductor device of claim 1, wherein said first fuse structure comprises a first contact region and a second contact region that provide electrical access to said first fuse structure.

4. The semiconductor device of claim 1, wherein said first fuse structure comprises a first fuse portion formed between said first and second ends of said first fuse structure and being adapted to permanently interrupt electrical connection between said first and second ends upon injecting a current into said first fuse portion that exceeds a current-carrying capacity of said first fuse portion.

5. The semiconductor device of claim 4, wherein said first fuse portion is in a permanently interrupted state.

6. The semiconductor device of claim 1, wherein said charge accumulation structure comprises a first portion with a first geometrical configuration and a second portion with a second geometrical configuration that is different from said first geometrical configuration, and wherein said first portion is electrically connected to said first end of said first fuse structure and said second portion is electrically connected to said first end of said second fuse structure.

7. The semiconductor device of claim 1, wherein said charge accumulation structure comprises a first portion with a first surface area and a second portion with a second surface area, and wherein said first portion is electrically connected to said first end of said first fuse structure and said second portion is electrically connected to said first end of said second fuse structure.

8. The semiconductor device of claim 7, wherein said first and second surface areas are substantially equal to each other.

9. The semiconductor device of claim 1, wherein said second fuse structure comprises a second fuse portion having a current-carrying capacity that differs from a current-carrying capacity of said first fuse portion.

10. The semiconductor device of claim 1, wherein said second end of said first fuse structure is connected to a first discharge portion of said discharge structure and said second end of said second fuse structure is connected to a second discharge portion of said discharge structure.

11. The semiconductor device of claim 1, wherein said second end of said first fuse structure is connected to a discharge portion of said discharge structure and said second end of said second fuse structure is connected to said discharge portion and wherein said discharge portion has a current-carrying capacity that is equal to or greater than a combined current-carrying capacity of said first fuse structure and said second fuse structure.

12. A semiconductor device, comprising:
a charge accumulation structure comprising a plurality of charge accumulation portions that includes at least a first charge accumulation portion having a first geometrical configuration and a second charge accumulation portion having a second geometrical configuration that is different from said first geometrical configuration, each of said plurality of charge accumulation portions being adapted to accumulate plasma-induced charges when exposed to a plasma ambient;
at least one discharge structure; and
a plurality of fuse structures comprising at least a first fuse structure and a second fuse structure, wherein said first fuse structure is electrically connected between said first charge accumulation portion and said at least one discharge structure and said second fuse structure is electrically connected between said second charge accumulation portion and said at least one discharge structure.

13. The semiconductor device of claim 12, wherein each of said plurality of charge accumulation structures is configured and adapted to accumulate a different amount of plasma-induced charges when exposed to a common plasma ambient.

14. The semiconductor device of claim 12, wherein said charge accumulation structures of said plurality of charge accumulation structures are configured and adapted to accumulate substantially equal amounts of plasma-induced charges when exposed to a common plasma ambient and wherein said fuse structures of said plurality of fuse structures have substantially equal current-carrying capacity.

15. The semiconductor device of claim 12, said at least one discharge structure being one of a plurality of discharge structures, wherein each respective discharge structure of said plurality of discharge structures is connected to a respective one of said plurality of fuse structures.

16. The semiconductor device of claim 12, wherein said plurality of charge accumulation structures are test structures.

17. A semiconductor device, comprising:
a charge accumulation structure comprising a plurality of charge accumulation portions that includes at least a first charge accumulation portion having a first surface area and a second charge accumulation portion having a second surface area, each of said plurality of charge accumulation portions being adapted to accumulate plasma-induced charges when exposed to a plasma ambient;
at least one discharge structure; and
a plurality of fuse structures comprising at least a first fuse structure and a second fuse structure, wherein said first fuse structure is electrically connected between said first charge accumulation portion and said at least one discharge structure and said second fuse structure is electrically connected between said second charge accumulation portion and said at least one discharge structure.

18. The semiconductor device of claim 17, wherein said first surface area of said first charge accumulation portion is substantially equal to said second surface area of said second charge accumulation portion.

19. The semiconductor device of claim 17, wherein said at least one discharge structure comprises a plurality of discharge structures, each respective discharge structure of said plurality of discharge structures being connected to a respective one of said plurality of fuse structures.

* * * * *